US006847085B2

(12) United States Patent
Hillyer et al.

(10) Patent No.: US 6,847,085 B2
(45) Date of Patent: Jan. 25, 2005

(54) HIGH ASPECT RATIO CONTACT SURFACES HAVING REDUCED CONTAMINANTS

(75) Inventors: Larry Hillyer, Boise, ID (US); Steve Byrne, Boise, ID (US); Kelly Williamson, Boise, ID (US); Doug Hahn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 10/188,147

(22) Filed: Jul. 3, 2002

(65) Prior Publication Data

US 2002/0192960 A1 Dec. 19, 2002

Related U.S. Application Data

(62) Division of application No. 09/653,561, filed on Aug. 31, 2000.

(51) Int. Cl.[7] .................. H01L 29/76; H01L 29/94; H01L 31/062; H01L 31/113; H01L 31/119
(52) U.S. Cl. ............................................. 257/382
(58) Field of Search ......................... 258/758, 309, 258/499, 412, 426, 329, 776, 510; 438/706; 257/99, 217, 382

(56) References Cited

U.S. PATENT DOCUMENTS

| 4,324,611 | A | | 4/1982 | Vogel et al. |
|---|---|---|---|---|
| 5,296,729 | A | | 3/1994 | Yamanaka et al. |
| 5,409,563 | A | | 4/1995 | Cathey |
| 5,444,018 | A | | 8/1995 | Yost et al. |
| 5,641,545 | A | | 6/1997 | Sandhu |
| 5,656,414 | A | | 8/1997 | Chou et al. |
| 5,658,438 | A | | 8/1997 | Givens et al. |
| 5,746,903 | A | | 5/1998 | Beilin et al. |
| 5,800,617 | A | | 9/1998 | Sandhu |
| 5,846,387 | A | | 12/1998 | Hoffman et al. |
| 5,872,061 | A | | 2/1999 | Lee et al. |
| 5,928,960 | A | | 7/1999 | Greco et al. |
| 5,939,777 | A | | 8/1999 | Zuniga |
| 5,948,702 | A | | 9/1999 | Rotondaro |
| 5,956,615 | A | * | 9/1999 | Nguyen et al. ............ 438/657 |
| 6,030,901 | A | | 2/2000 | Hopper et al. |
| 6,242,165 | B1 | | 6/2001 | Vaartstra |
| 6,284,664 | B1 | | 9/2001 | Kawai |
| 6,291,890 | B1 | | 9/2001 | Hamada |
| 6,342,446 | B1 | * | 1/2002 | Smith et al. ............ 438/687 |
| 6,365,453 | B1 | * | 4/2002 | Deboer et al. ............ 438/253 |

* cited by examiner

Primary Examiner—Craig A. Thompson
(74) Attorney, Agent, or Firm—Dickstein Shapiro Morin & Oshinsky LLP

(57) ABSTRACT

Contact openings in semiconductor substrates are formed through insulative layers using an etchant material. The etchant typically leaves behind a layer of etch residue which interferes with the subsequent deposition of conductive material in the opening, as well as the conductive performance of the resulting contact. A method of etch removal from semiconductor contact openings utilizes ammonia to clean the surfaces thereof of any etch residue.

8 Claims, 6 Drawing Sheets

100.0 nm 40.0 nm

HIGH ASPECT RATIO CONTACT SURFACES HAVING REDUCED CONTAMINANTS

This application is a divisional of U.S. patent application Ser. No. 09/653,561, entitled METHOD AND MATERIAL FOR REMOVING ETCH RESIDUE FROM HIGH ASPECT RATIO CONTACT SURFACES, filed Aug. 31, 2000. The entirety of this parent application is hereby incorporated by reference herein.

FIELD OF THE INVENTION

The present invention relates to a novel method and material for removing etch residue from high aspect ratio contacts, and more specifically, to a process and material for cleaning contact opening surfaces without substantially increasing the size or depth of the contact opening and without producing a silicon rich oxide at the bottom of the contact opening.

BACKGROUND OF THE INVENTION

One goal in forming many high aspect ratio (HAR) contacts in integrated circuits is the deposition of a very thin layer of titanium at the bottom of an etched opening, such as a via or trench. This layer facilitates electrical contact between the contact material which will subsequently fill the opening and the material to which it connects, e.g. doped polysilicon. Prior to this deposition, an etching solution is utilized to form the openings necessary in an insulative layer, for example, Boro-Phospho-Silicate Glass (BPSG) or other insulator layer to provide the HAR contact access to an exposed underlying conductive material. This conductive material is usually formed of doped polysilicon, or some other conductive substance. The thin titanium layer reacts with this polysilicon, usually in the presence of heat, to form a titanium silicide layer.

Unfortunately, the materials used for etching the BPSG layer typically leave a polymer residue which ends up coating the inside and especially the bottom of the HAR contact opening. This residue must be removed before a titanium deposition can be initiated. The traditional way of removing this residue has been through the utilization of an oxygen ($O_2$) plasma strip step. The etch polymer residue reacts with the oxygen and is removed.

This process however, can leave behind a silicon rich oxide residue layer at the bottom of the opening because the oxygen also reacts with the polysilicon. The silicon rich layer can be represented as $SiO_x$, with x being between 0 and 2. This layer can also contain impurities, for example, carbon and fluorine impurities. This silicon rich oxide layer residue is substantially non-conductive, and therefore interferes with the deposition and of a conductive titanium material in the etched opening and the subsequent formation of a desirable titanium silicide layer at the bottom of the contact opening. This in turn affects the conductive performance of a conductor formed in the opening.

Traditional "wet chemistries" have been employed to remove the silicon rich oxide layer formed as a result of $O_2$ plasma stripping to further assist in preparing the HAR bottom surface opening for Ti deposition. However, these methodologies have not been entirely successful in removing the silicon rich oxide layer. These chemical methods are not generally selective to the silicon rich oxide layer, and thus they can undesirably also etch the BPSG sidewalls of the opening and thereby increase its size.

What is therefore needed is an improved process for removing polymer etch residue from HAR contact openings which eliminates the formation of a silicon rich oxide layer within the contact opening. The process should also effectively eliminate the etch polymer from both the sides and bottom of the HAR opening without undesirably increasing its size.

SUMMARY OF THE INVENTION

The invention provides a method for removing etch residue from High Aspect Ratio openings, e.g. vias and trenches, in silicon wafer devices which involves contacting their surfaces with ammonia during at least a latter part of polymer residue removal. The method removes the polymer etch residue, without producing a silicon rich oxide layer within the contact opening and without substantially increasing the size of the contact opening. The invention permits the reliable deposition of a thin conductive layer, e.g. of titanium at the bottom of the contact opening, which can be used to form a silicide to improve the conductive performance of a conductor formed in the contact opening.

The invention also provides an integrated circuit having an ammonia-cleaned, polymer residue-free and silicon rich oxide-free high aspect ratio opening in an insulating layer.

The invention also provides a method of forming a contact opening in a semiconductor device which involves first etching a contact opening in an insulative layer in the device down to a polysilicon plug and then cleaning etch residue from the opening using ammonia gas.

Additional advantages and features of the present invention will become more readily apparent from the following detailed description and drawings which illustrate various embodiments of the invention.

DETAILED DESCRIPTION OF THE PREFERRED EMBODIMENTS

The invention is directed to the removal of etch residue from contact openings or vias formed in semiconductor wafers. While all such contact openings or vias are contemplated herein, particular reference will be made to high aspect ratio (HAR) contact openings. As that term is used herein, "high aspect ratio" refers to aspect ratios from about 0.5:1 to about 20.0:1. Furthermore, reference shall also be made to the terms "wafer" and "substrate", which are to be understood as including silicon, silicon-on-insulator (SOI) or silicon-on-sapphire (SOS) substrates, doped and undoped semiconductors, epitaxial layers of silicon supported by a base semiconductor foundation, and other semiconductor structures. In addition, when reference is made to a "wafer" or "substrate" in the following description, previous process steps may have been utilized to form regions, junctions or layers in or over the base semiconductor structure or foundation. In addition, the semiconductor need not be silicon-based, but could be based on silicon-germanium, germanium or gallium arsenide.

Figure 1:
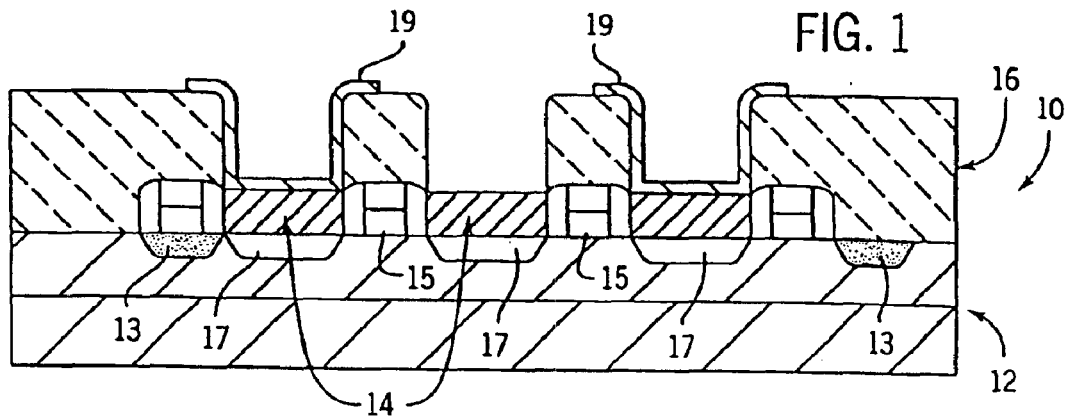
FIG. 1 is a cross sectional view of a portion of an integrated circuit wafer in a intermediate stage of fabrication of a memory device.

Referring now to the drawings in which like numerals indicate like components throughout the various embodiments, FIG. 1 illustrates a portion of an integrated circuit wafer 10 at an intermediate stage of fabrication of a memory device. The integrated circuit wafer section 10 has a substrate 12. The substrate is formed of a material such as silicon. Field oxide regions 13, transistor gate stacks 15, doped regions 17 and capacitors 19 (illustrated as a single layer 19 but which actually contains a plurality of material layers as well know) are formed over the substrate. The substrate 12 also has conductive areas in the form of polysilicon "plugs" 14 formed thereon which have been deposited through a first layer of insulating material 16, which is usually a type of glass oxide well known in the art, for example, BPSG. The first layer of insulating material 16 may, in actuality, be formed as one or more layers of insulating material of, for example, BPSG.

Figure 2:
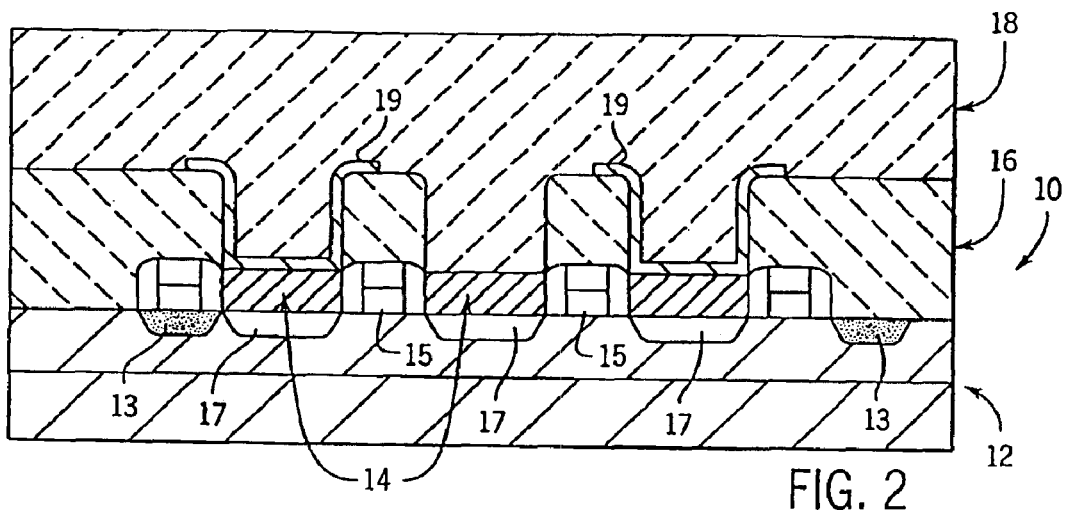
FIG. 2 is the wafer of FIG. 1 having an insulative layer deposited thereon.
Figure 3:
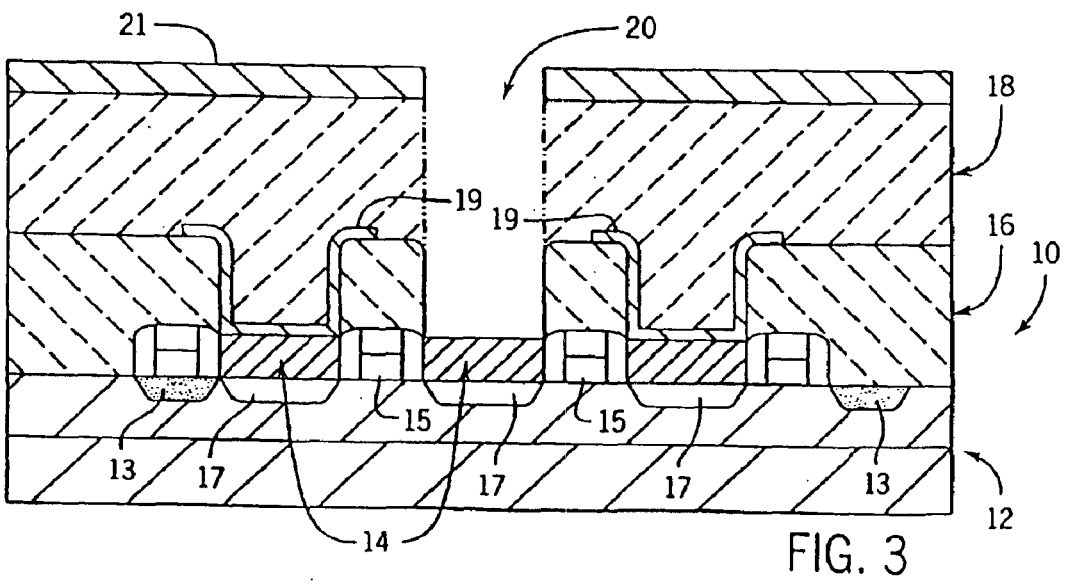
FIG. 3 is the wafer of FIG. 2 in which contact openings have been formed in the insulative layer.

Referring now to FIGS. 2 and 3, in the formation of HAR contact openings, a second layer of insulating material 18 is first deposited over the first layer 16. As shown in FIG. 3, contact openings 20 are then formed through this second insulative layer 18 so as to contact the polysilicon conductive plugs 14. Openings 20 are formed through a patterned photoresist mask 21 which defines locations or areas to be etched, i.e. the openings. To form the HAR contact opening, an etchant is applied to the insulating layer 18. Dry etching techniques known in the art are utilized for this purpose. Fluorine-containing gases, for example, are applied to the surface of the insulating layer 18 to form the opening 20. A non-exhaustive listing of such gases includes $CH_2F_2$, $CHF_3$, $C_2F_6$, $C_2HF_5$, and $CH_3F$, which may be used alone or in combination. After etching, the photoresist layer 21 is removed.

Figure 4:
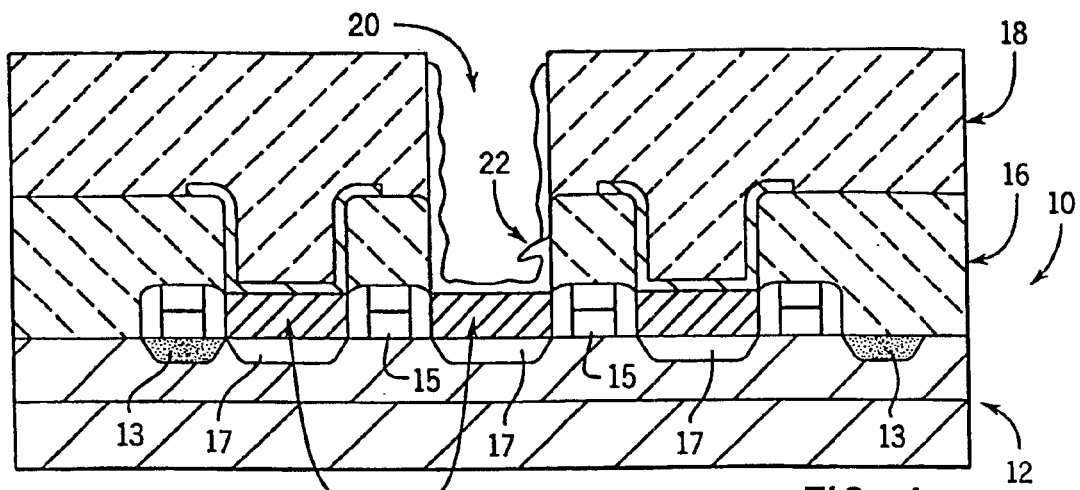
FIG. 4 is the wafer of FIG. 3 showing etch residue in the contact openings.

As shown in FIG. 4, the etched opening 20 extends to the underlying plug 14. Unfortunately, after etching a polymer etch residue 22 is left in the opening 20, both on the sidewalls and the bottom of opening 20. This etch residue must be removed to enable a subsequent conductor placed in the opening to obtain good electrical contact with plug 14. Moreover, the deeper the opening 20, the more difficult it becomes to remove the etch residue 22 from the bottom thereof. Present attempts to remove this residue 22 typically involved an $O_2$ plasma etch, for example.

Figure 5:
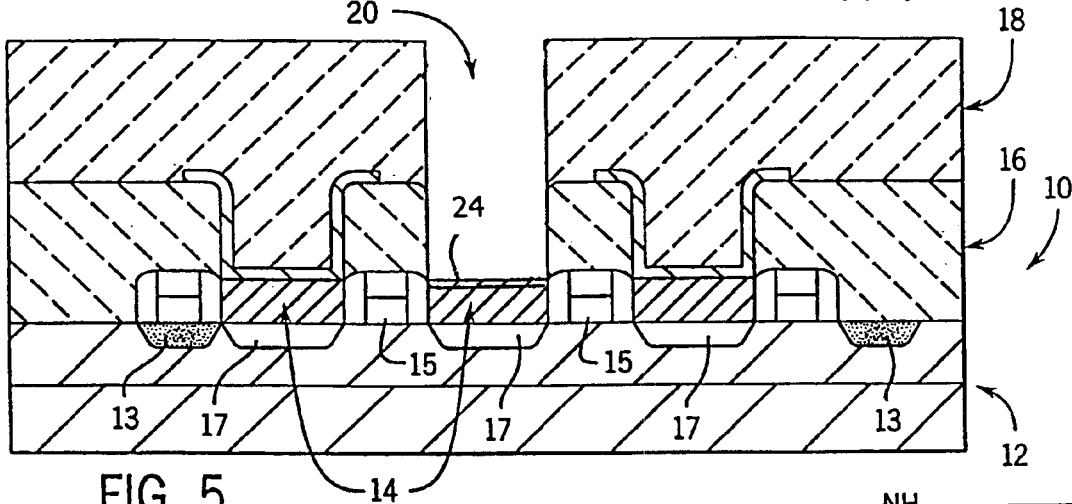
FIG. 5 is the wafer of FIG. 4 in which a silicon rich oxide layer is formed in the contact openings.

As shown in FIG. 5, the $O_2$ plasma etch method has not proven entirely satisfactory, however. The oxygen plasma can remove the polymer residue 22, but in turn will form an undesirable layer 24 of a silicon rich oxide which can vary in depth over the bottom of the opening 20.

It is especially undesirable to have this oxidized layer 24 at the bottom of the HAR opening. This layer is relatively non-conductive and can interfere with both the deposition and the conductivity of a subsequently-deposited thin conductive layer such as for example, titanium, which is used to form a silicide layer between a conductor material deposited in the opening and the underlying contact area, e.g. polysilicon. Since the underlying conductive area is typically formed of polysilicon, deposition of titanium coupled with a heat treatment yields a titanium silicide layer. The presence, however, of silicon rich residue can inhibit the formation of a desired layer of titanium silicide and leave an oxide rich material on the bottom of the contact opening which can interfere with subsequent processing steps during the contact fill process. The overall effect can significantly reduce conductivity, and affect device performance and yield.

The invention uses ammonia to remove the polymer etch residue. The use of ammonia to strip the polymer etch residue significantly reduces or eliminates oxidation of the HAR contact opening, thereby leaving a substantially oxide free side and bottom of the opening for the subsequent deposition of a conductive layer. Moreover, the use of ammonia does not substantially increase the size of the HAR opening, i.e. does not widen or deepen the opening as the reaction does not etch the BPSG sidewalls of the opening. As that term is used herein, "does not substantially increase" means an insignificant increase from an operational standpoint, for example, an increase of no more than a few Angstroms (Å), e.g. about 5 Angstroms, more preferably about 1–2 Angstroms.

As used herein, "ammonia" refers to $NH_3$ in whatever form. Preferably, the ammonia will be in the form of a plasma, or as may be otherwise typically utilized in the art.

Operating parameters for the process of removing etch residue are set forth below. Preferably, the skilled artisan will find the use of an apparatus known in the industry as a Fusion Gemini Reactor useful for practicing the method of etch removal according to the various embodiments described herein. However, other apparatus are within the scope of the invention and will be similarly useful.

The ammonia should typically be applied at a temperature within the range of about 250–500° C. It is even more desirable to utilize temperatures within the range of about 300–400° C. Especially preferred is a temperature of about 350° C.

Operating pressure should be within the range of about 0.5–5 torr, and is most typically at about 1.5 torr. The applied wattage is usually within the range of about 500–5000 watts, with a range of about 1500–2000 watts being even more preferred. In many circumstances, 1900 watts will be especially desirable. A typical plasma coil can be utilized for providing the power necessary for the process of the invention.

The ammonia is applied to the HAR contact opening(s) at a rate within the range of about 100 to 4000 SCCM of $NH_3$, for a period of usually less than about 100 seconds. In a preferred embodiment, the time of ammonia contact with the opening 20 can be about 75 seconds or less. The rate of application, time of operation and amount of $NH_3$ can vary somewhat according to particular operating conditions. Those skilled in the art may find that as the temperature goes up, the operating time can go down. Likewise, as the power is increased the time of operation may decrease as well.

Figure 6:
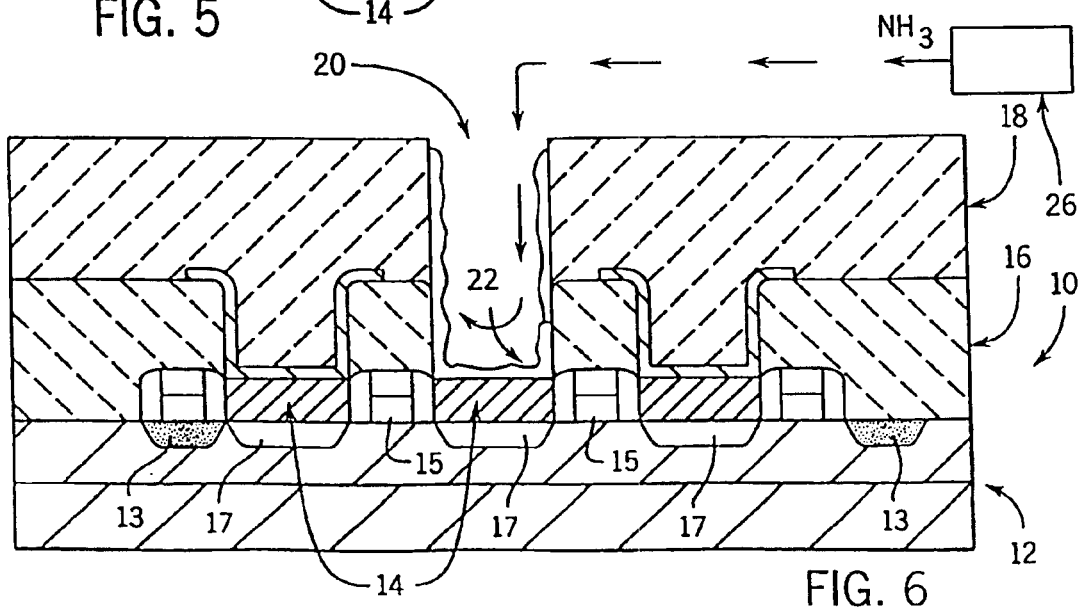
FIG. 6 is the wafer of FIG. 5 illustrating the process of the invention according to one embodiment.

Referring now to FIG. 6, an exemplary embodiment of the process of the invention is illustrated: Using a fusion reactor 26, pressure is maintained at approximately 1.5 torr. The temperature of the reactor 26 is also set at about 350°. With an operating wattage of about 1900, $NH_3$ flows to the reaction chamber at a rate of about 750 SCCM, these conditions being sufficient to remove the etch residue 22. After no more than about 100 seconds, the $NH_3$ will have cleaned the polymer etch residue from the opening, while not substantially increasing its size. In addition, no silicon rich oxide is present at the bottom of the opening.

Figure 7:
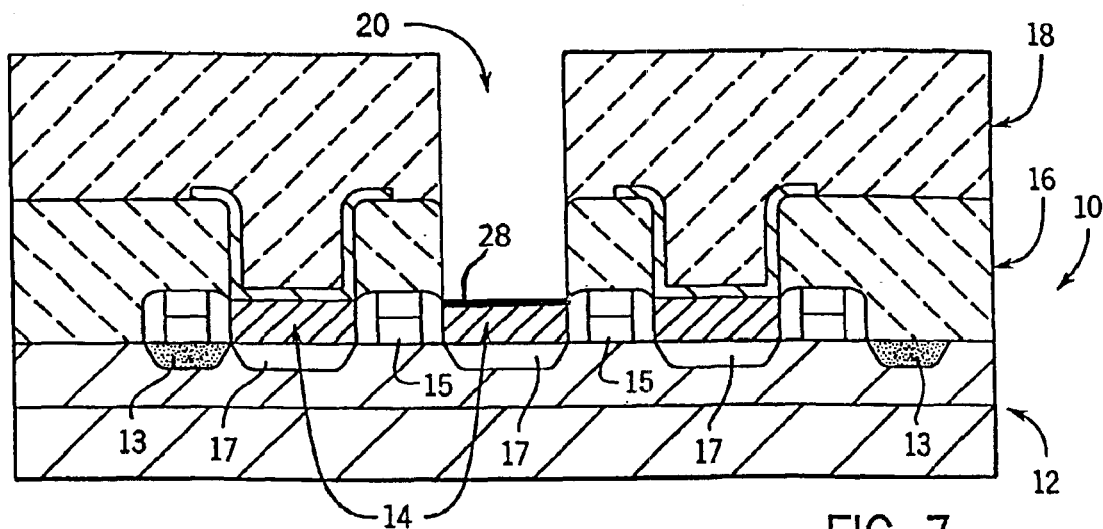
FIG. 7 is the wafer of FIG. 6 in which the contact opening has been cleaned of etch residue.

FIG. 7 shows the same wafer 10 as shown in FIG. 6 after the process of the invention has been completed. As can now be seen in FIG. 7, the HAR contact opening 20 is clean of any polymer etch residue. At the same time, there is no significant increase in the size of the contact opening and no silicon rich oxide layer is present at the bottom of the contact opening. In this embodiment only NH3 gas is used as the active gas to remove the polymer residue. A thin nitride layer 28 may be formed over the polysilicon plug 14.

In another embodiment of the invention, a conventional $O_2$ plasma dry etch may first be utilized to remove a large portion of the polymer residue up to a point where some etch residue still remains at the bottom of the opening. This may be done using in situ techniques known in the art. Also possible is a standard ex situ process using a resist stripper. Following this conventional $O_2$ plasma etch, the ammonia dry etch, as heretofore described, is then used to complete removal of the polymer residue, including at the bottom of the opening without producing a silicon rich oxide. In addition, it is also possible to utilize hydrogen gas or methane in lieu of $NH_3$ during the polymer removal step.

The invention uses the ammonia to clean the HAR contact opening of polymer etch residue without silicon oxidation of either the side walls or the bottom surface thereof In this way, there is no substantial increase in the size of the HAR contact. It is therefore desirable, if possible, not to utilize any added oxygen, e.g. during a pretreatment step, in conjunction with the ammonia etch residue removal process.

In certain instances, the application of ammonia to the HAR contact surfaces, including the bottom substrate, may leave behind a thin layer of nitride deposit, shown as thin layer 28 in FIG. 7. If the bottom substrate is formed of polysilicon, this deposit may take the form of silicon nitride ($Si_3N_4$). The optional application of a standard wafer cleaning solution such as ammonium chloride or phosphoric acid, can be used to remove all or substantially all of this thin nitride layer. In any event, application of ammonia, with or without the preceding $O_2$ polymer etch removal step, will most typically yield a clean opening bottom surface without a silicon rich oxide layer thereon.

Figure 8:
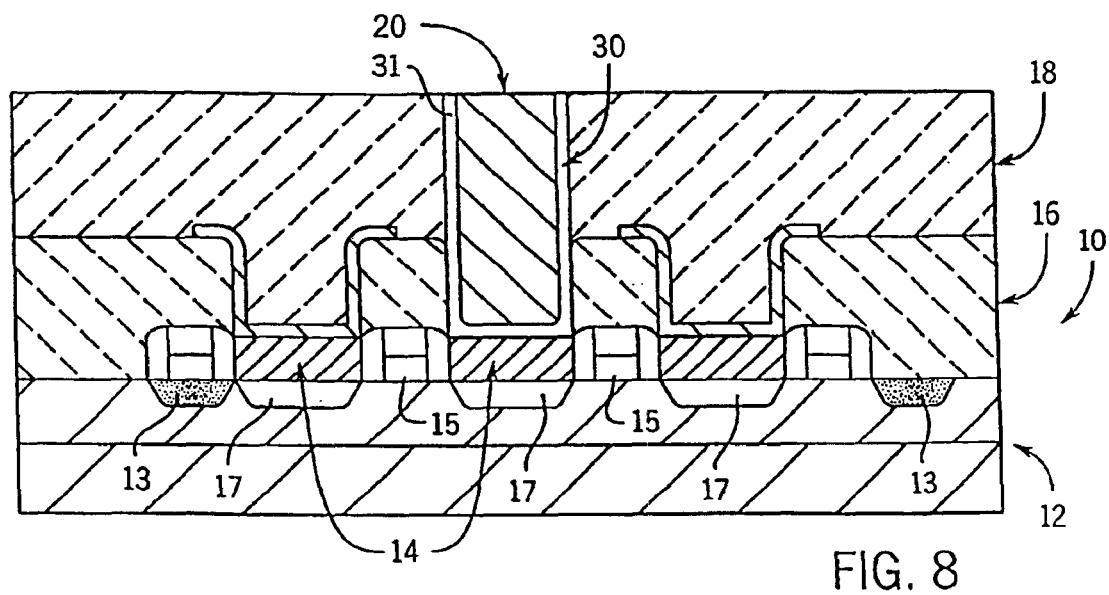
FIG. 8 is the wafer of FIG. 7 in which a tungsten plug has been formed in the contact opening.

Referring now to FIG. 8, following application of ammonia to remove the etch residue, and the optional step of wash chemistry to remove any remaining nitride layer, the HAR opening is now ready for application of a thin conductive layer of titanium (Ti) 31, which will form a silicide at the bottom of the contact opening 20, and subsequent steps to form a conductor 30 in contact with the bottom surface of the opening.

Titanium deposition in the contact opening 20 can be done in a manner known in the art. For example, titanium is deposited on the wafer using a sputter process commonly used with metals. A target containing titanium is surrounded by an argon plasma. Ions from the plasma hit the target surface. The titanium atoms which are removed from the metal target then coat the wafer surface. It is also possible to utilize CVD techniques in which the titanium is formed from the reaction of $TiCl_4$ with hydrogen ($H_2$). In any event, the deposition material should get down into the High Aspect Ratio opening, and reach the bottom surface of the opening or via 20. A collimator may be used to direct the atoms straight down, for better coverage on the contacts.

Titanium coats the inside of the contacts to improve the adhesion of a subsequently applied conductor plug 30, typically comprised of tungsten, within the opening 20 of the insulative layer, eg. BPSG. Following titanium deposition, there is a titanium anneal process which converts the titanium layer incontact with the polysilicon plug into Ti-silicide and possibly Ti-nitride. Single wafers are placed in a nitrogen purged AG chamber, now more commonly known as a STEAG system for RTP (rapid thermal process). The chamber or system contains heat lamps which raise the temperature to within the range of about 700–750° C. As the temperature increases, the titanium reacts with polysilicon at the bottom surface in the contact opening 20 to form Ti-silicide. The titanium may also react with the nitrogen in the chamber to produce Ti-nitride. Once annealed, the titanium is thus converted into two conductive material layers, Ti-silicide and Ti-nitride, which both reduce the contact resistance, with the Ti-nitride layer primarily acting as a silicon barrier during the tungsten deposition process. These layers will also help protect the silicon substrate from being damaged by the subsequent tungsten deposition process.

The tungsten layer or "plug" provided in the HAR contact opening may be used, for example, to provide a conductive connection between metal runners and a memory cell in an integrated circuit.

A processing chamber can be used to deposit the tungsten onto the surfaces of the wafer, and into the HAR contact opening. This is typically a two-step process which uses tungsten hexafluoride ($WF_6$) and silane ($SiH_4$) to begin the tungsten deposition. The silane provides a silicon source to tie up free fluorine atoms which can damage the substrate. After the initial layer of tungsten is produced, the deposition process is enhanced by replacing the silane with hydrogen gas. After tungsten "plug" deposition, the wafers may be rinsed and the integrated circuit is then ready for further fabrication according to methods known in the art. FIG. 8 shows the device of FIG. 7 in which a conductive plug 30 has been formed in the contact opening 20.

Figure 9A:
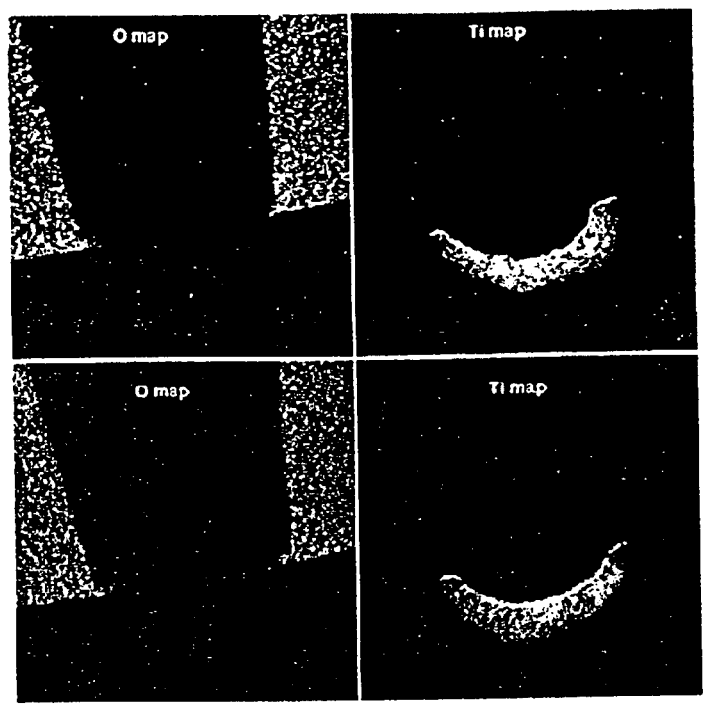
FIG. 9A is a microphotograph representing exposed side views of a first and second actual bottom contact surface which have been cleaned and layered in accordance with an embodiment of the invention.
Figure 9B:
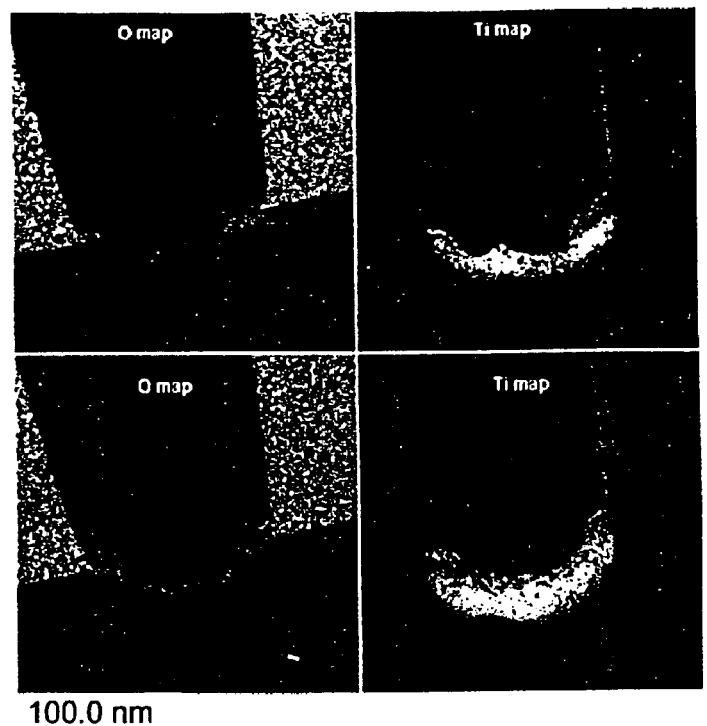
FIG. 9B is a microphotograph representing exposed side views of a third and fourth bottom contact surface as a comparative example.
Figure 9C:
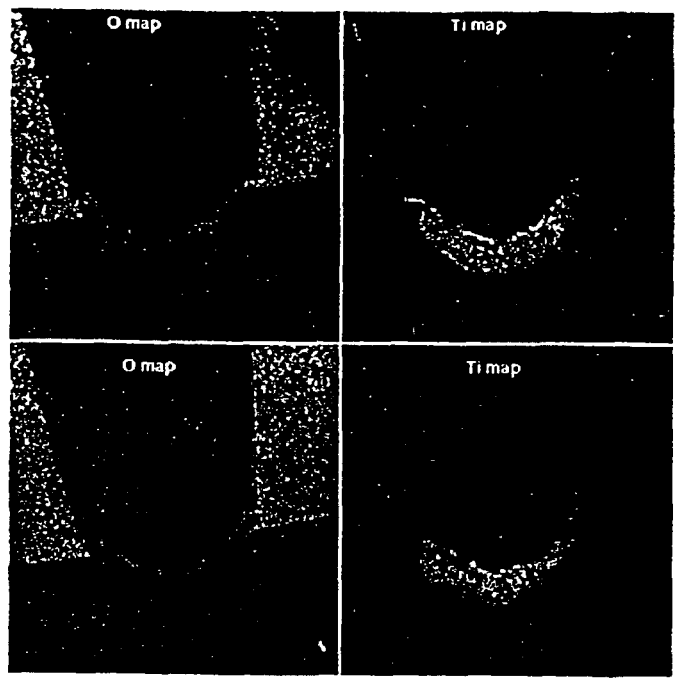
FIG. 9C is a microphotograph representing exposed side views of a fifth and sixth bottom contact surface as a second comparative example.

Referring now to FIGS. 9–10, there is presented actual microphotographs further illustrating the process of the invention, as compared with conventional $O_2$ stripping. The top two microphotographs in FIG. 9 A represent high resolution exposed side views of a first contact opening bottom surface in a semiconductor device. The bottom two microphotographs FIG. 9A represent high resolution exposed side views of a second contact opening bottom surface. The top two and bottom two microphotographs in FIG. 9B represent high resolution exposed side views of a third and fourth contact opening bottom surface, respectively. The top two and bottom two microphotographs in FIG. 9C represent high resolution exposed side views of a fifth and sixth contact opening bottom surface, respectively. In FIG. 9A, both the first and second contact opening bottom surfaces have been cleaned of polymer etch residue with ammonia only according to the process of the invention, followed by deposition of titanium, and subsequent deposition of a thin layer of titanium nitride followed by a layer of tungsten. In FIG. 9B, a comparative example, the third and fourth contact opening bottom surfaces have been cleaned of etch residue using conventional $O_2$ stripping with bias, followed by high temperature $O_2$ stripping with no bias. Following $O_2$ stripping, subsequent deposition of titanium and tungsten layers has occurred as in FIG. 9A. FIG. 9C, a second comparative example, the fifth and sixth contact opening bottom surfaces have been cleaned of etch residue using a high temperature $O_2$ strip with no bias. Following $O_2$ stripping, subsequent deposition of titanium and tungsten layers has occurred as in FIG. 9A. In each of FIGS. 9A–C, the top left and bottom left microphotographs have been specially photographed to illuminate any oxygen present. The top right and bottom right microphotographs of each of FIGS. 9A–C have been specially photographed to show the presence of titanium and tungsten. In FIG. 9A, which represents the process of the invention, both the top left and the bottom left microphotographs are dark, indicating that little or no oxygen is present in the first and second bottom opening contact surfaces. However, in both of FIGS. 9B and C, each of the top and bottom left photographs have a grainy white appearance at the bottom surface of each of the third through sixth contact openings, indicating the presence of a substantial amount of oxygen left over from stripping. In FIG. 9A, the top and bottom right microphotographs are bold with clean lines, indicating the successful deposition of titanium in the first and second contact opening bottom surfaces. The thin band which can be observed across the top of the titanium silicide layer is the titanium nitride layer. In each of FIGS. 9B and 9C, however, the deposited titanium and titanium nitride layers are much less pronounced with considerably more blurring. This indicates a less successful deposition on each of the third through sixth bottom surfaces, which is likely to have a negative impact on conductivity.

Figure 10A:
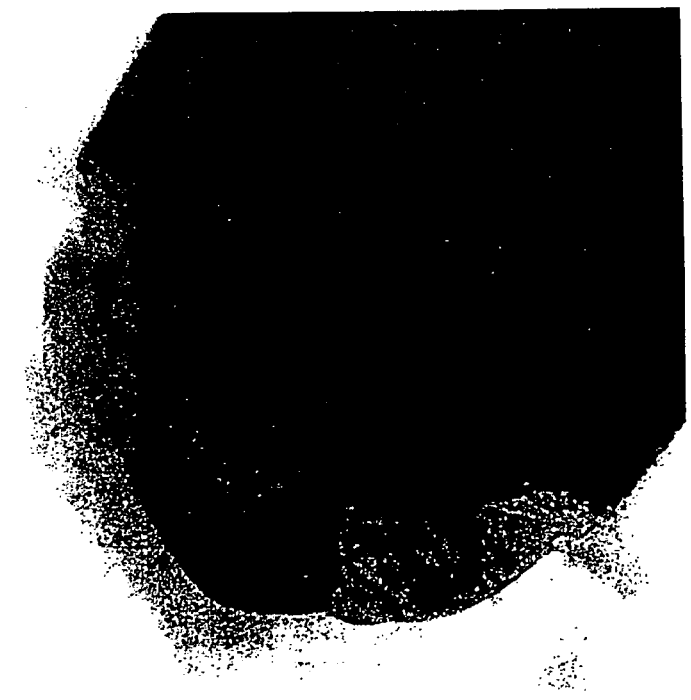
FIG. 10A is a microphotograph representing an exposed side view of another contact opening bottom surface.
Figure 10B:
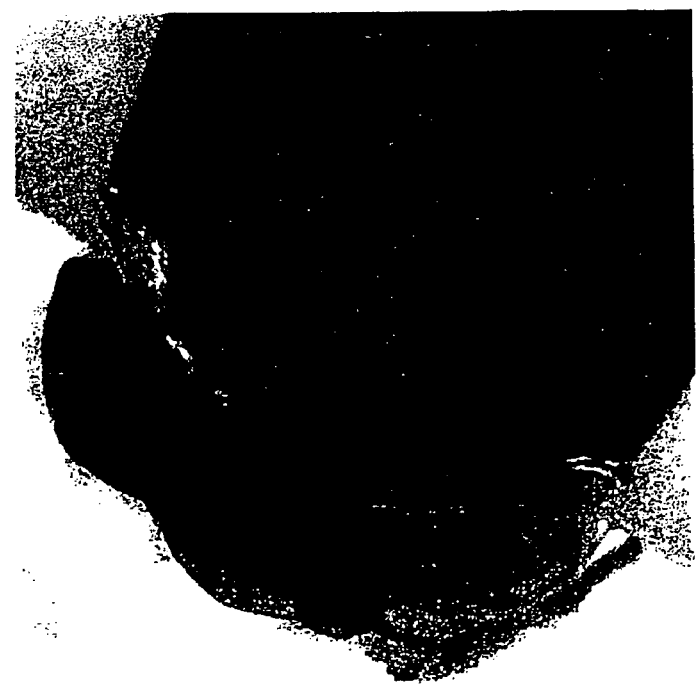
FIG. 10B is a microphotograph representing an exposed side view of yet another bottom surface as a comparative example to FIG. 10A.
Figure 10C:
FIG. 10C is a microphotograph representing an exposed side view of still another bottom surface as a second comparative example to FIG. 10A.

FIGS. 10A, 10B and 10C are high resolution microphotographs showing three additional contact opening bottom surfaces in side view close-ups. In FIG. 10A, the contact opening bottom surface has been cleaned of polymer etch residue with ammonia only according to the process of the invention, followed by deposition of titanium, and subsequent deposition of a thin layer of tungsten. In FIG. 10B, a comparative example, the contact opening bottom surface has been cleaned of etch residue using conventional $O_2$ stripping with bias, followed by high temperature $O_2$ stripping with no bias. Following $O_2$ stripping, subsequent deposition of titanium and tungsten has occurred as in FIG. 10A. In FIG. 10C, a second comparative example, the contact opening bottom surface has been cleaned of etch residue using a high temperature $O_2$ strip with no bias. Following $O_2$ stripping, subsequent deposition of titanium, titanium nitride and tungsten has occurred as in FIG. 10A. As seen similarly with FIG. 9A, FIG. 10A shows a cleanly formed deposition layer of titanium, together with a well-defined thin band of tungsten across the top thereof. In contrast, both of FIGS. 10B and C present rather blurry, much less defined layers of titanium and tungsten, which is indicative of less successful depositions.

Although the invention has been described in connection with etching an opening or via for formation of a conductive plug, the invention can also be used to etch and subsequently etch-residue clean any opening, including, for example, openings used for form container capacitors in a memory circuit. Thus, the above description is only illustrative of exemplary embodiments which achieve the features and advantages of the present invention. It is not intended that the present invention be limited to these exemplary embodiments. Any modification of the present invention which comes within the spirit and scope of the following claims should be considered part of the present invention.

What is claimed as new and desired to be protected by Letters Patent of the United States is:

1. A semiconductor device, comprising:
  a substrate;
  an active area within said substrate;
  a polysilicon plug in contact with said active area;
  a dielectric layer over said active area and said polysilicon plug;
  an opening through said dielectric layer to said polysilicon plug, said opening having a high aspect ratio; and
  a conductive contact within said opening and in contact with said polysilicon plug at an interface, said interface being substantially free of oxygen.

2. The semiconductor device of claim 1, wherein said conductive contact comprises a titanium-containing layer at said interface.

3. The semiconductor device of claim 1, wherein said conductive contact comprises a titanium silicide layer at said interface and a tungsten layer thereover.

4. A semiconductor device, comprising:
  a substrate;
  an active area within said substrate;
  a polysilicon plug in contact with said active area;
  a dielectric layer over said active area and said polysilicon plug;
  an opening through said dielectric layer to said polysilicon plug, said opening having a high aspect ratio of about 0.5:1 to about 20.0:1; and
  a conductive contact within said opening and in contact with said polysilicon plug at an interface, said interface being substantially free of oxygen.

5. A semiconductor device, comprising:
  a substrate;
  an active area within said substrate;
  a polysilicon plug in contact with said active area;
  a dielectric layer over said active area and said polysilicon plug;
  an opening through said dielectric layer to said polysilicon plug, said opening having a high aspect ratio; and
  a conductive contact within said opening and in contact with said polysilicon plug at an interface, said interface being substantially free of polymer etch residue and oxygen.

6. The semiconductor device of claim 5, wherein said conductive contact comprises a titanium-containing layer at said interface.

7. The semiconductor device of claim 5, wherein said conductive contact comprises a titanium silicide layer at said interface and a tungsten layer thereover.

8. A semiconductor device, comprising:
  a substrate;
  an active area within said substrate;
  a polysilicon plug in contact with said active area;
  a dielectric layer over said active area and said polysilicon plug;
  an opening through said dielectric layer to said polysilicon plug, said opening having a high aspect ratio of about 0.5:1 to about 20.0:1; and
  a conductive contact within said opening and in contact with said polysilicon plug at an interface, said interface being substantially free of polymer etch residue and oxygen.

* * * * *